US010089670B2

(12) United States Patent
Slaton et al.

(10) Patent No.: US 10,089,670 B2
(45) Date of Patent: Oct. 2, 2018

(54) SYSTEM AND METHOD FOR ANALYZING A POWERTRAIN CONFIGURATION

(71) Applicant: PACCAR Inc, Bellevue, WA (US)

(72) Inventors: Zachary Slaton, Lynnwood, WA (US); Richard Hampson, Redmond, WA (US); Todd Wickstrum, Argyle, TX (US)

(73) Assignee: PACCAR INC, Bellevue, WA (US)

( * ) Notice: Subject to any disclaimer, the term of this patent is extended or adjusted under 35 U.S.C. 154(b) by 359 days.

(21) Appl. No.: 14/997,325

(22) Filed: Jan. 15, 2016

(65) Prior Publication Data

US 2016/0132951 A1 May 12, 2016

Related U.S. Application Data

(62) Division of application No. 13/010,638, filed on Jan. 20, 2011, now Pat. No. 9,268,882.

(51) Int. Cl.
G06Q 30/00 (2012.01)
G06Q 30/06 (2012.01)
G06F 17/50 (2006.01)
G06Q 10/00 (2012.01)

(52) U.S. Cl.
CPC ......... *G06Q 30/0621* (2013.01); *G06F 17/50* (2013.01); *G06F 17/5095* (2013.01); *G06Q 30/0641* (2013.01); *G06Q 10/00* (2013.01)

(58) Field of Classification Search
CPC . G06Q 30/0601–30/0643; G06Q 30/08; G06F 17/50
See application file for complete search history.

(56) References Cited

U.S. PATENT DOCUMENTS

| 6,064,982 A | 5/2000 | Puri |
| 6,104,988 A | 8/2000 | Klarer |
| 6,364,812 B1 | 4/2002 | Robichaux et al. |
| 6,412,012 B1 | 6/2002 | Bieganski et al. |
| 6,810,401 B1 | 10/2004 | Thompson et al. |
| 8,214,069 B2 | 7/2012 | Yücel et al. |

(Continued)

FOREIGN PATENT DOCUMENTS

| EP | 1 583 039 A1 | 5/2005 |
| KR | 10-2006-0045045 A | 5/2006 |
| KR | 10-2008-0018534 A | 2/2008 |
| WO | 2010/041382 A1 | 9/2009 |

OTHER PUBLICATIONS

Office Action dated Oct. 6, 2017, issued in corresponding Application No. EP 12 736 852.0, filed Jan. 20, 2012, 7 pages.

(Continued)

*Primary Examiner* — William J Allen
(74) *Attorney, Agent, or Firm* — Christensen O'Connor Johnson Kindness PLLC

(57) ABSTRACT

A powertrain optimization device and method that compares a predicted performance of customer-selected vehicle components to a customer-selected optimization goal. The optimization goal is used to determine dynamic performance thresholds. The method compares gradability at cruise, gradability at peak torque, engine speed, and startability to the dynamic thresholds to determine whether the vehicle performance will be satisfactory. The customer selections of vehicle components, selections of optimization goals, and any acknowledgements of failed performance checks are stored for later use.

10 Claims, 13 Drawing Sheets

(56) References Cited

U.S. PATENT DOCUMENTS

| | | |
|---|---|---|
| 2001/0034726 A1 | 10/2001 | McMahon |
| 2004/0087414 A1 | 5/2004 | Markyvech |
| 2006/0015411 A1 | 1/2006 | Mela |
| 2010/0262321 A1 | 10/2010 | Daum et al. |
| 2010/0332350 A1 | 12/2010 | Rinehart et al. |
| 2011/0196572 A1 | 8/2011 | Tsuchikiri et al. |
| 2012/0089479 A1 | 4/2012 | Felando Mattson |

OTHER PUBLICATIONS

Examiner's Report dated Oct. 23, 2017, issued in corresponding Canadian Application No. 2,824,395, filed Jan. 20, 2012, 4 pages.

Extended European Search Report dated May 30, 2016, issued in corresponding European Application No. EP 12736852.0, filed Jan. 20, 2012, 6 pages.

Mexican Office Action dated Mar. 28, 2016, issued in corresponding Mexican Application No. MX/a/2015/013688, filed Jan. 20, 2012, 4 pages (with English summary).

International Search Report and Written Opinion dated Oct. 4, 2012, issued in corresponding International Application No. PCT/US2012/022037, filed Jan. 20, 2012, 7 pages.

"Products—Innovative Software Solutions for Sales and Engineering," Certusoft, Minneapolis, Oct. 18, 2009, <web.archive.org/web/20091019122430/http://www.certusoft.com/products-order-manager.html> [retrieved Aug. 22, 2013], 4 pages.

Second Office Action, dated Feb. 4, 2015, issued in corresponding Mexican Application No. MX/a/2013008298, filed Jan. 20, 2012, and explanatory letter in English from the Mexican Associate, 6 pages.

| Optimization Goal | | Powertrain Optimizer | | | | | | | | | | | |
|---|---|---|---|---|---|---|---|---|---|---|---|---|---|
| ● Performance | | | | | | | | | | | | | |
| ○ Balance | | Engine: PACCAR MX-485 2010 485@1900 1650@1100 | | | | | | | | | | | |
| ○ Fuel Economy | | Transmission: Fuller RTLO18918B 18-speed | | | | | | | | | | | |
| | | Rear Axle: Dual Dana Spicer DSP40 rear axle rated at 40K. 4.11 Ratio | | | | | | | | | | | |
| 2.64 | | Rear Tires: Bridgestone M720FE 295/75R22.5 14PR | | | | | | | | | | | |
| 2.93 | | Operating Conditions: 0.7% Rolling Resistance, Engine Fan: Off | | | | | | | | | | | |
| 3.08 | | | | | | | | | | | | | |
| 3.25 | | Transmission | %Maximum | Aux Transmission | Transfer Case | | | | | | | | |
| 3.36 | | Ratio: | Starting Grade: | Ratio: | Ratio: | | | | | | | | |
| 3.42 | | 14.40 | 33.99 | XX | XX | | | | | | | | |
| 3.55 | | 12.29 | 29.00 | XX | XX | | | | | | | | |
| 3.70 | | | | | | | | | | | | | |
| 3.90 | | Engine RPM: | 1100 | 1200 | 1300 | 1400 | 1500 | 1600 | 1700 | 1800 | 1900 | 2000 | 2100 |
| *4.11 | | Gross Torque: | 1649 | 1650 | 1649 | 1649 | 1649 | 1585 | 1491 | 1408 | 1334 | 1115 | 918 |
| 4.33 | | Gear Ratios: | TRN:(17) | 0.86 | - | - RAX: (1) | 4.11 | 4.11 | | | | | |
| 4.63 | | Speed (MPH): | 36.6 | 40.0 | 43.3 | 46.6 | 50.0 | 53.3 | 56.6 | 60.0 | 63.3 | 66.6 | 69.9 |
| 4.83 | | Grade (%): | 3.1 | 3.1 | 3.0 | 3.0 | 2.9 | 2.7 | 2.4 | 2.2 | 1.9 | 1.3 | 0.7 |
| | | Gear Ratios: | TRN:(18) | 0.73 | - | - RAX: (1) | 4.11 | 4.11 | | | | | |
| | | Speed (MPH): | 43.0 | 46.9 | 50.8 | 54.7 | 58.6 | 62.5 | 66.4 | 70.3 | 74.2 | 78.1 | 82.0 |
| Typical Operating | | Grade (%): | 2.4 | 2.4 | 2.3 | 2.3 | 2.2 | 2.0 | 1.7 | 1.4 | 1.2 | 0.6 | 0.1 |
| Speed | | | | | | | | | | | | | |
| 60mph/97kph | | PASS Minimum recommended gradability at peak torque in top gear is 1.3%. The current configuration is 2.4%. | | | | | | | | | | | |
| | | PASS To optimize for Performance the recommended operating range is 1450 – 1800 RPM. 60 MPH occurs at 1536 RPM. | | | | | | | | | | | |
| | | PASS Minimum recommended gradability at 60 mph is 0.5%. At 60 mph the current configuration is 2.13%. | | | | | | | | | | | |
| | | [ Help ] [ Print ] [ OK ] | | | | | | | | | | | |

*Fig.3A.*

SYSTEM AND METHOD FOR ANALYZING A POWERTRAIN CONFIGURATION

CROSS-REFERENCE TO RELATED APPLICATION

This application is a division of U.S. patent application Ser. No. 13/010,638, filed Jan. 20, 2011, the entire disclosure of which is hereby incorporated by reference herein.

BACKGROUND

When ordering certain types of vehicles, such as trucks, a customer may be presented with a wide variety of vehicle configuration options. For example, with respect to a vehicle powertrain, a customer may be able to select from a variety of available engines, transmissions, axles, tires, and the like. While a given manufacturer may offer a wide variety of each of these components, it may not be immediately clear which particular selections are viable for use in combination with other particular selections. With the demand for vehicle configurability during the ordering process comes a need to assist customers in determining what particular vehicle configurations are appropriate.

Some existing systems may review selections made by a customer to determine whether selected components are capable of functioning together, or may recommend certain components based upon prior customer inputs. However, none of the existing systems address the nonintuitive nature of selecting components to optimize performance of a powertrain. Each selected component may affect performance in ways that depend on other component selections, and therefore the effect of choosing a given component may not be easily understood. What is needed is a system that guides a customer through a process of selecting powertrain components that, in combination, will meet performance optimization goals of the customer.

SUMMARY

In one embodiment of the present disclosure, a nontransitory computer-readable medium is provided. The computer-readable medium has computer-executable instructions stored thereon that, if executed by one or more processors of a computing device, cause the computing device to perform actions for receiving vehicle powertrain configuration selections. The actions comprise receiving at least one specification value; receiving at least one expected use value; determining one or more powertrain optimization goals achievable with the at least one specification value for the at least one expected use value; and transmitting the one or more powertrain optimization goals for presentation.

In another embodiment of the present disclosure, a computer-implemented method of optimizing a vehicle powertrain is provided. The method comprises obtaining a set of specification values and an optimization goal, and obtaining a set of additional configuration options compatible with the set of specification values. For each additional configuration option of the set of additional configuration options, a test value associated with the additional configuration option is calculated based on the optimization goal. The set of additional configuration options is presented along with an indication of which additional configuration options of the set of additional configuration options are associated with a positive test value.

In yet another embodiment of the present disclosure, a system is provided, the system comprising one or more computer processors, a memory, and a computer-readable medium. The computer-readable medium has computer-executable components stored thereon that, if executed by one or more of the computer processors, cause the system to perform actions for optimizing a vehicle powertrain during an ordering process. The actions comprise receiving a selection of one or more specification values representing vehicle components; receiving information regarding an expected use of the vehicle; receiving a selection of an optimization goal; displaying one or more rear axle ratios compatible with the one or more specification values, along with an indication of which of the one or more rear axle ratios meet the selected optimization goal; and receiving a selection of a rear axle ratio.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this disclosure will become better understood by reference to the following detailed description, when taken in conjunction with the accompanying drawings, wherein:

FIGS. 3A-3D illustrate embodiments of a powertrain optimization interface according to various aspects of the present disclosure.

DETAILED DESCRIPTION

Embodiments of the present disclosure provide a system and a method for configuring a vehicle powertrain. Embodiments of the present disclosure collect vehicle configuration information and desired optimization goals from a customer. Such embodiments also present an analysis of whether the vehicle, as configured, meets the optimization goal while maintaining a baseline performance level. The vehicle configuration can then be changed further, and real-time feedback on how changing the configuration affects the performance and optimization of the vehicle is presented to the customer. The final configuration, along with any acknowledgement made by the customer to ignore optimization goals, can be added to an order for the vehicle to provide information for troubleshooting future customer problems.

Figure 1:
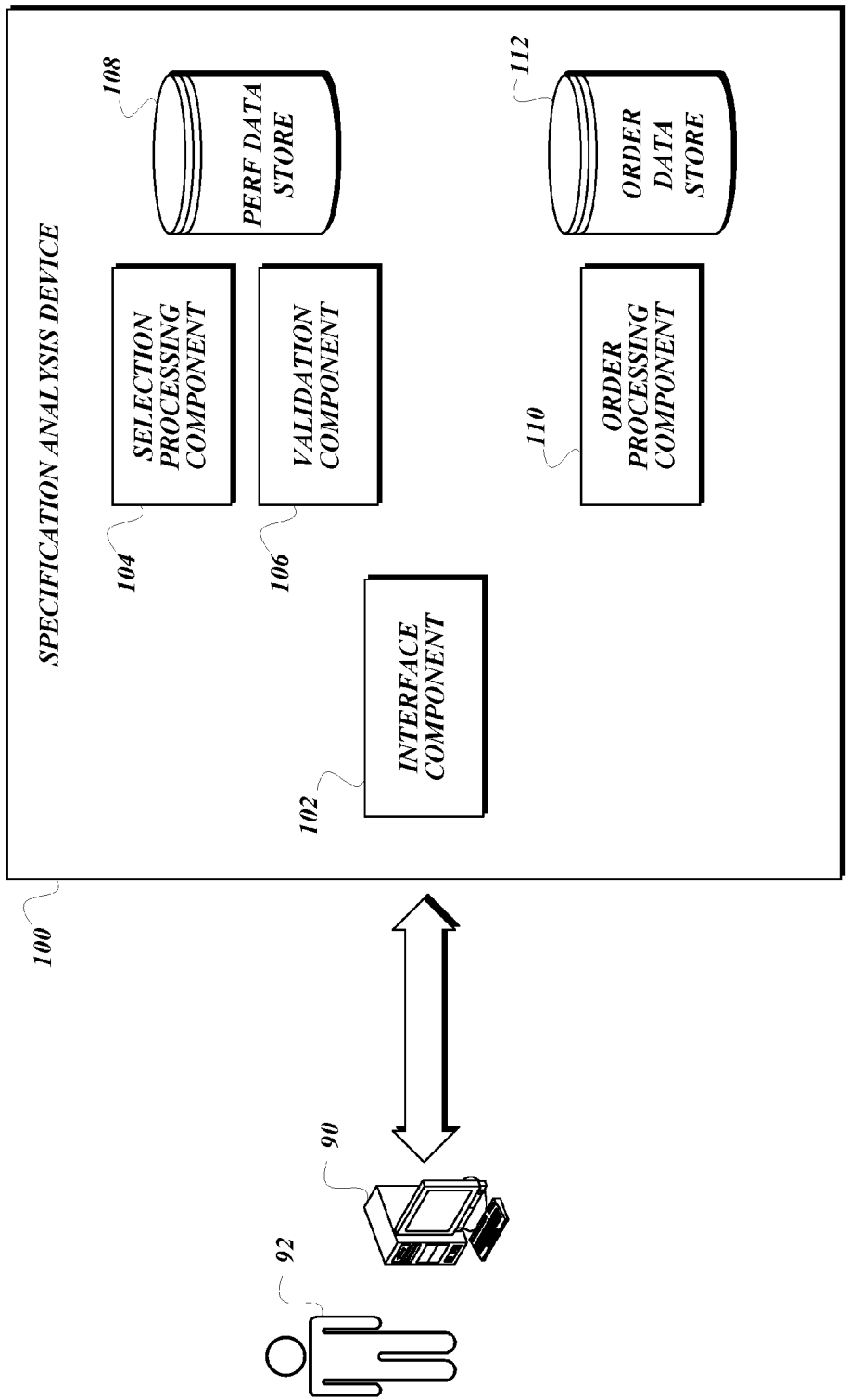
FIG. 1 illustrates one embodiment of a system for assisting a customer to configure a vehicle powertrain, according to various aspects of the present disclosure.
Figure 2A:
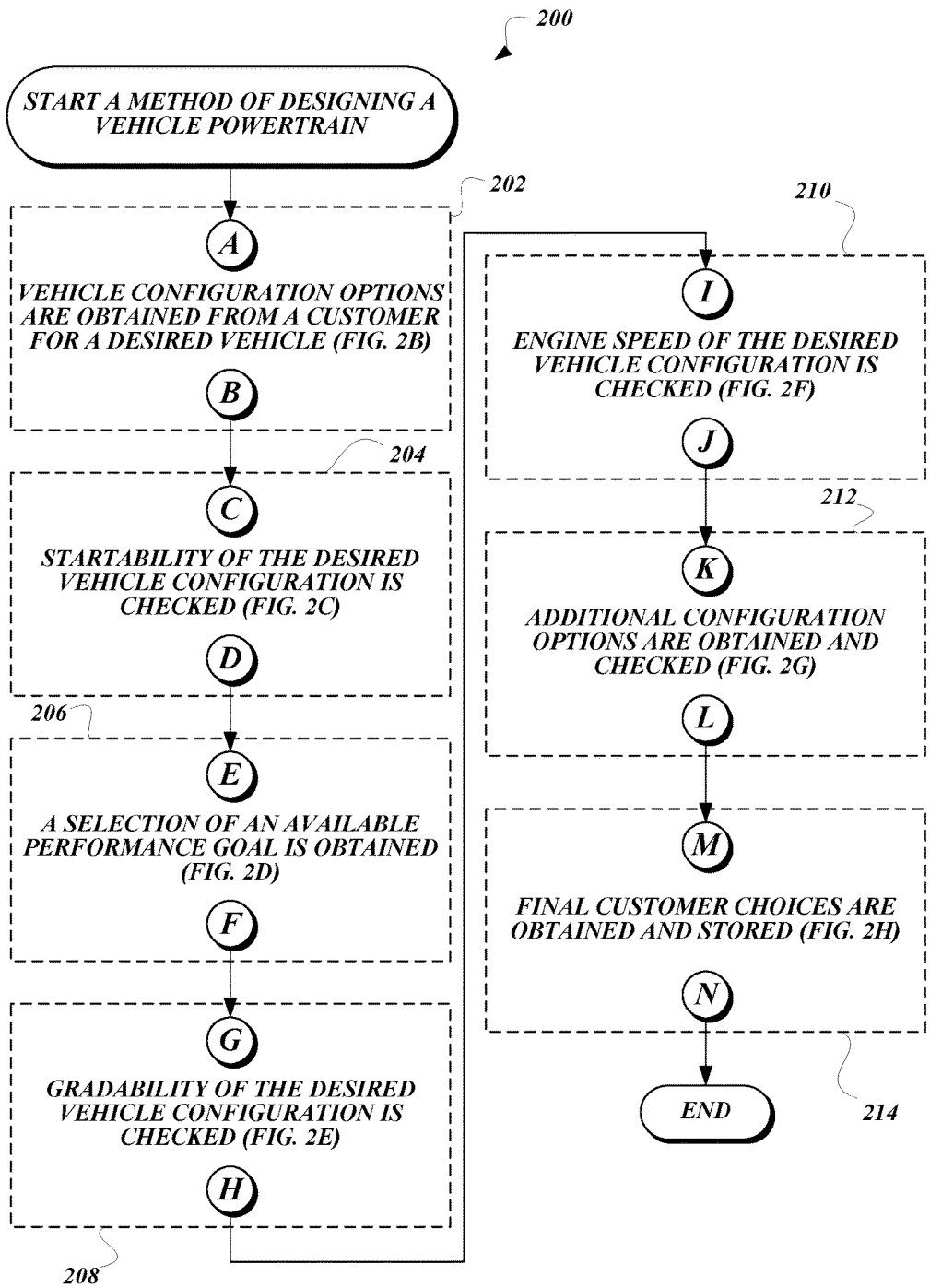
FIGS. 2A-2H illustrate one embodiment of a method of designing a vehicle powertrain according to various aspects of the present disclosure.
Figure 2B:
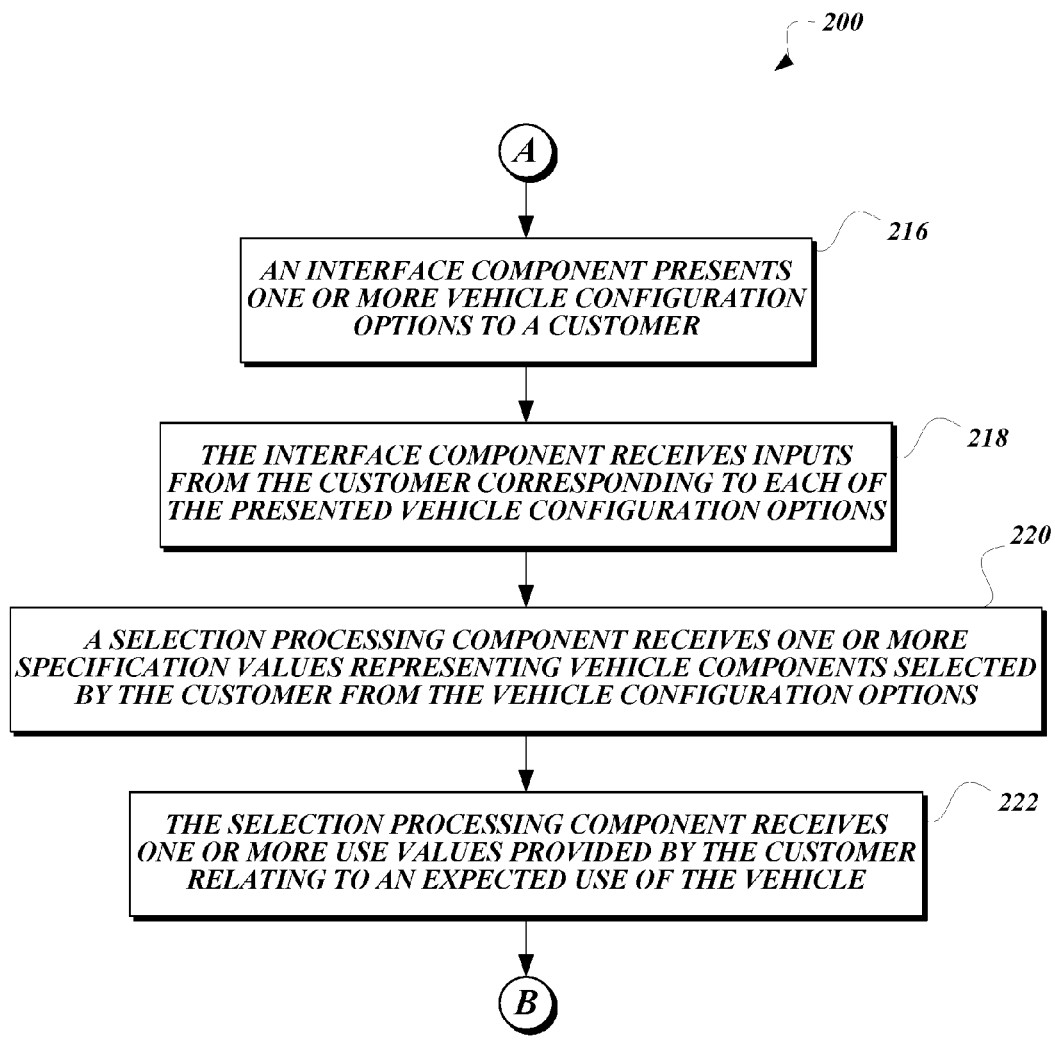
Figure 2C:
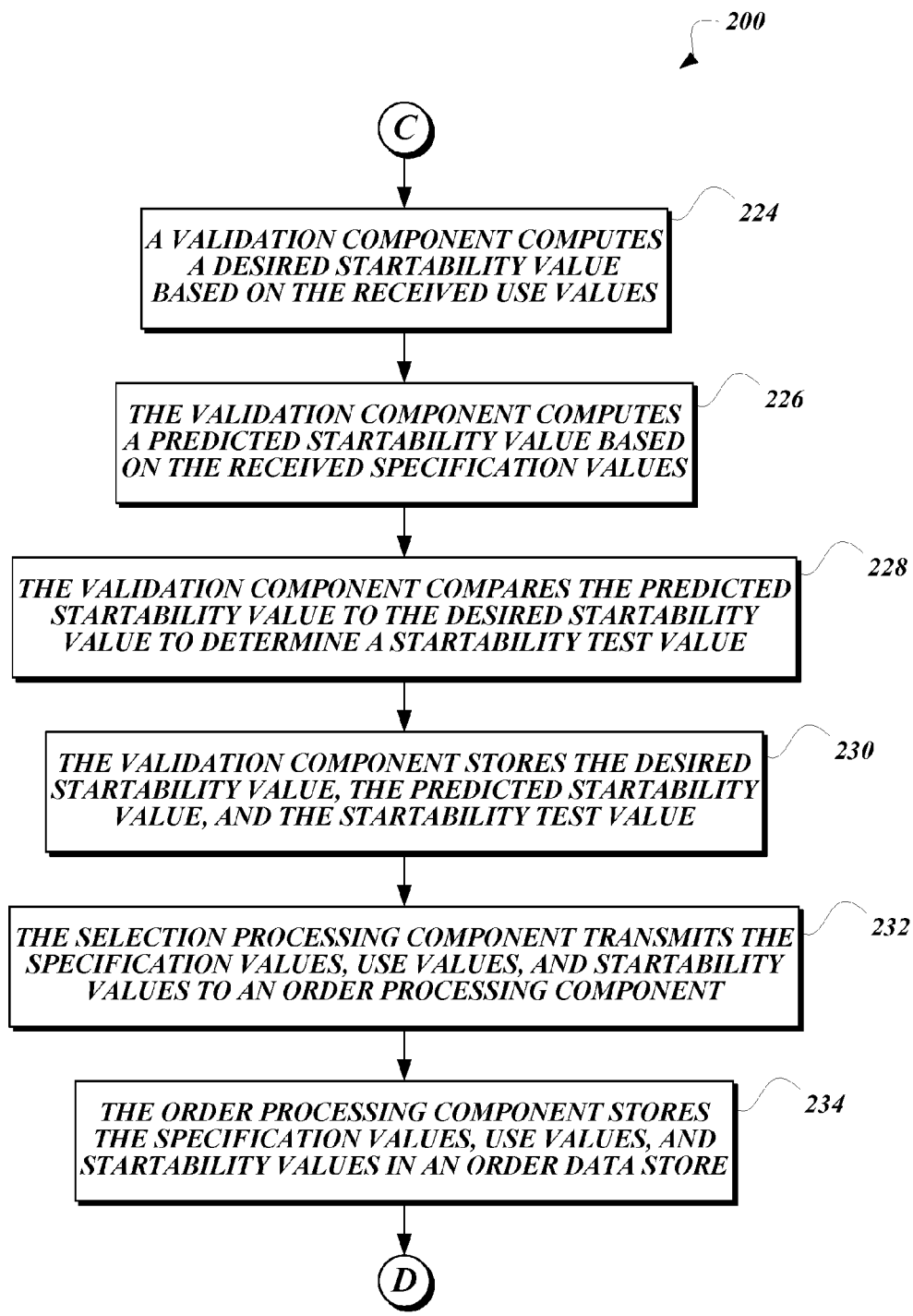
Figure 2D:
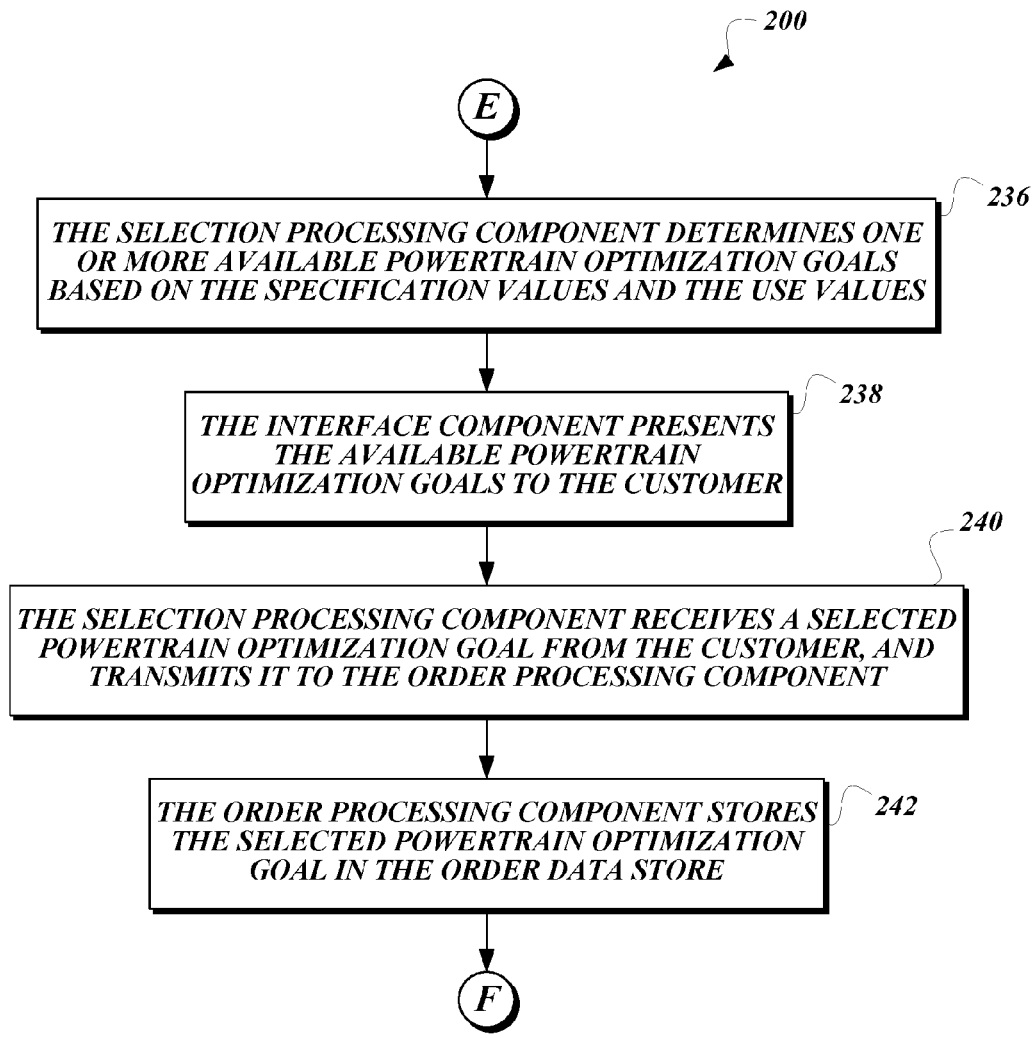
Figure 2E:
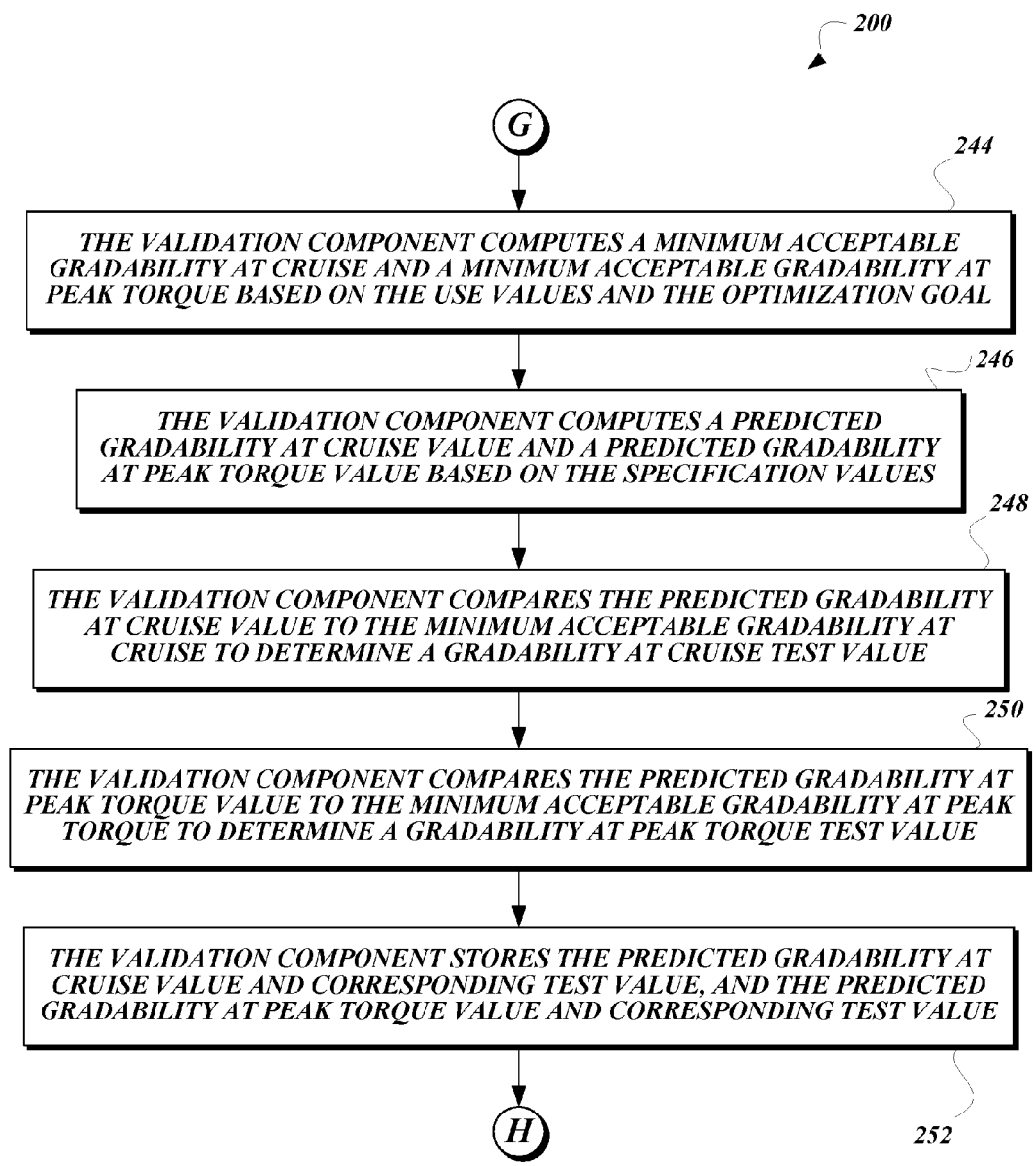
Figure 2F:
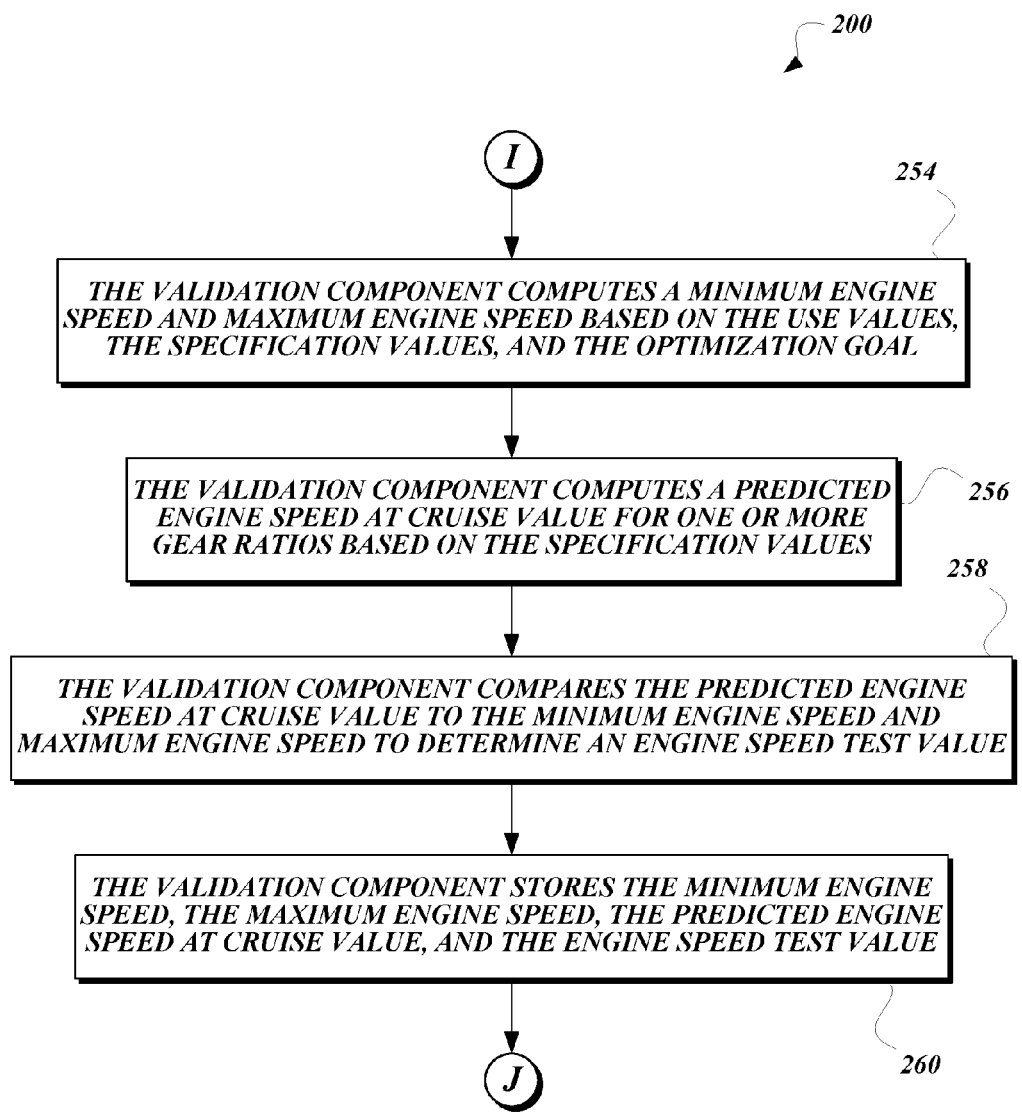
Figure 2G:
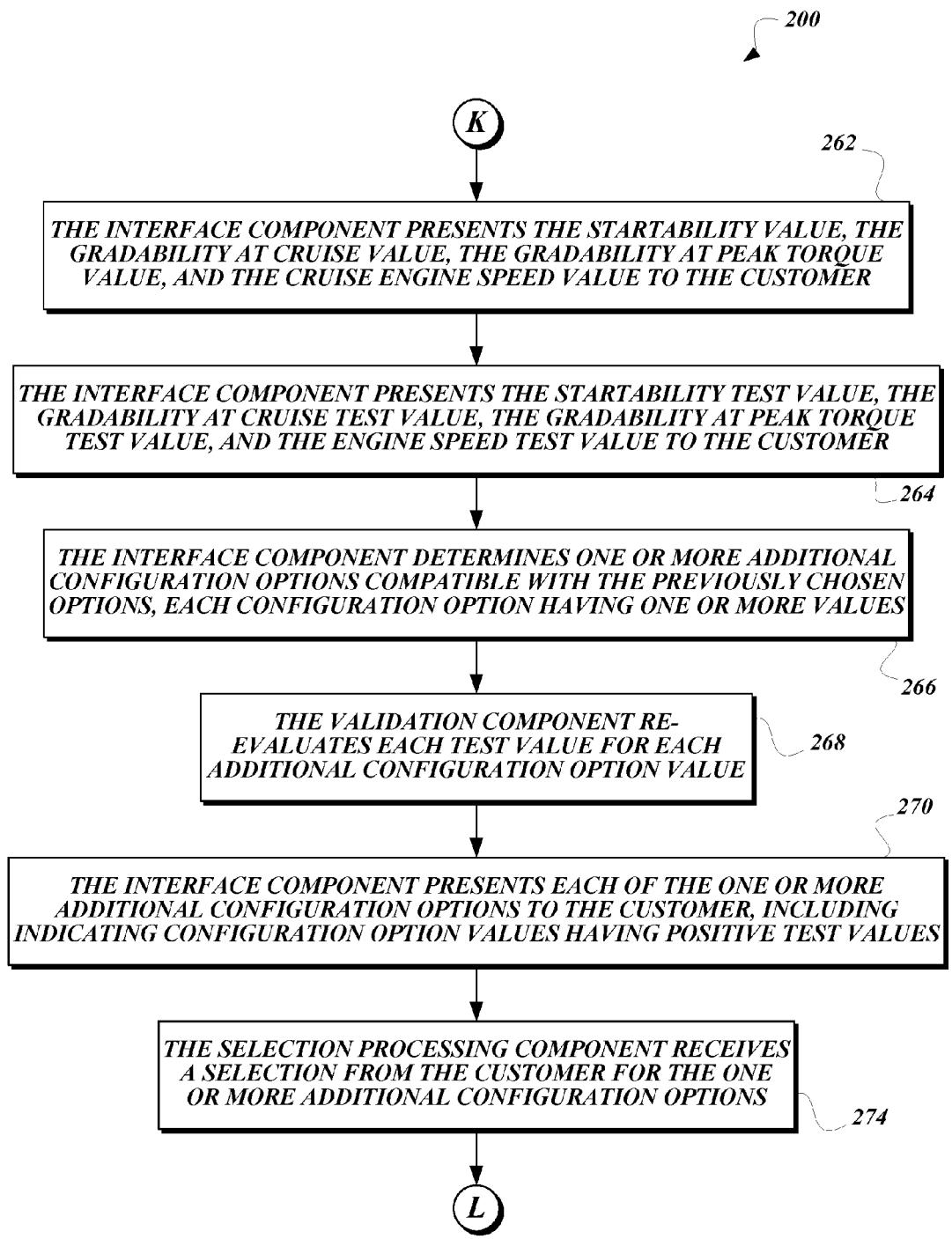
Figure 2H:
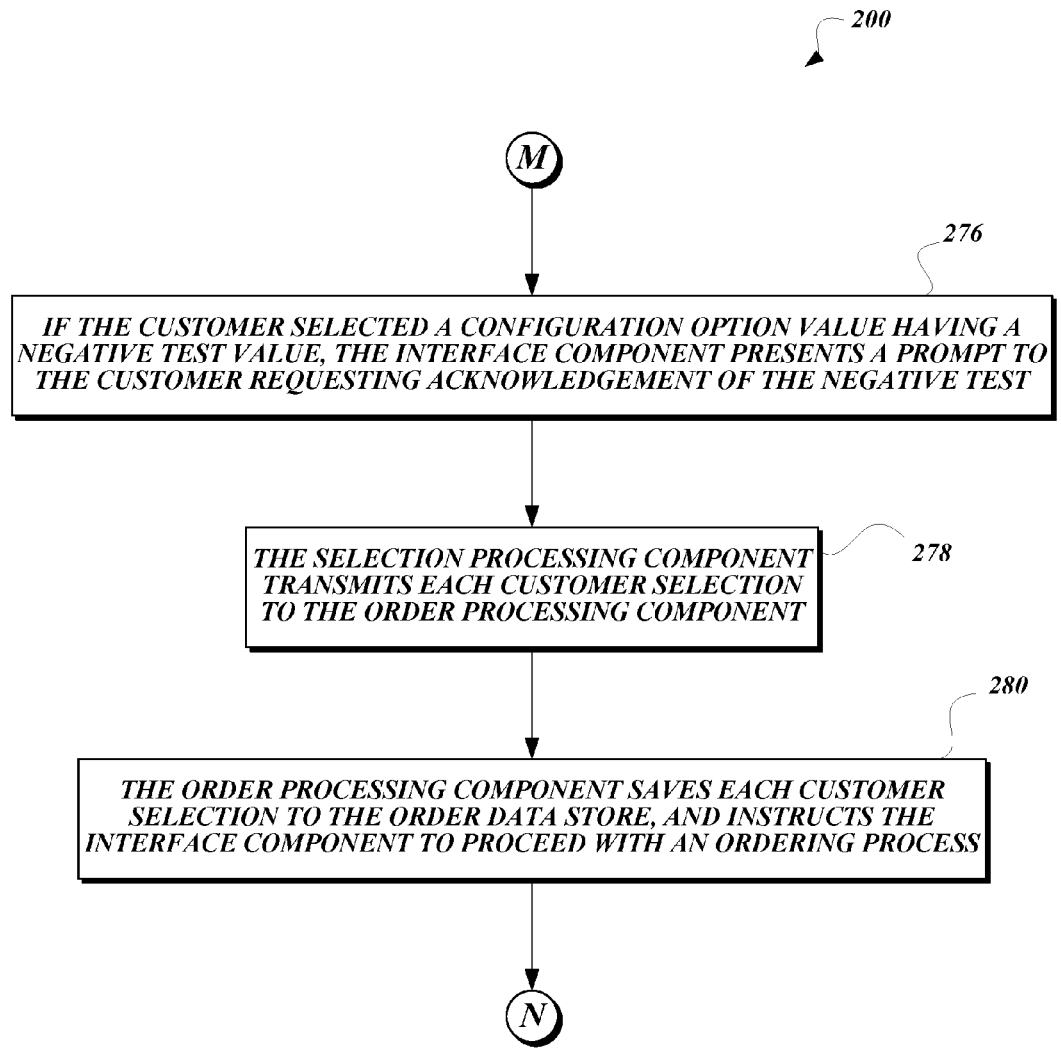

FIG. 1 illustrates one embodiment of a system for assisting a customer to configure a vehicle powertrain. A customer 92 uses a client computing device 90 to connect to a powertrain configuration device 100. The client computing device 90 may be any type of computing device capable of connecting to the powertrain configuration device 100 and capable of presenting an interface to the customer 92. In the illustrated embodiment, the client computing device 90 is a desktop computer that includes one or more processors, a memory, computer-readable storage media, a display device, and a network interface. In another embodiment, the client computing device 90 is some other type of computing device having a display, at least one processor, and a memory. Examples of other types of computing devices include a laptop computer, a tablet computer, a mobile device, a point-of-sale system, and the like. The client computing device 90 may connect to the powertrain configuration device 100 via a standard web browser or through a stand-alone program.

In the illustrated embodiment, the customer 92 uses the client computing device 90 directly to access the powertrain configuration device 100. However, in another embodiment, the customer 92 may use an agent, such as a vehicle salesperson in a showroom, to operate the client computing device 90. Such changes in how the customer 92 provides the information to the powertrain configuration device 100 are within the scope of the appended claims.

The powertrain configuration device 100 may be any type of computing device configurable to execute the components described below and to communicate with the client computing device 90. In one embodiment, the powertrain configuration device 100 is a server computer having one or more processors, a memory, computer-readable storage media, and a network interface. In another embodiment, the powertrain configuration device 100 is a different type of computer, such as a laptop computer, a desktop computer, and the like. In yet another embodiment, the components of the powertrain configuration device 100 may be executed on more than one computing device, or may be executed by the client computing device 90.

The powertrain configuration device 100 includes components such as an interface component 102, a selection processing component 104, a validation component 106, and an order processing component 110. The interface component 102 is configured to communicate with the other components of the powertrain configuration device 100. The interface component 102 also presents an interface rendered by the client computing device 90 to the customer 92 to allow the customer 92 to configure and order a powertrain. The selection processing component 104 is configured to obtain possible powertrain configuration options from which the customer 92 can choose, and then to process the selections made by the customer 92. The validation component 106 is configured to perform calculations on the selections received by the selection processing component 104 in order to determine whether various performance and optimization goals can be achieved by the selected powertrain configuration. After powertrain components have been selected by the customer 92, the order processing component 110 can convert those selections into an order to be fulfilled by an order fulfillment pipeline (not pictured).

In one embodiment, each of the "components" discussed above as parts of the powertrain configuration device 100 include a computing device or a portion of a computing device specially programmed with computer-executable instructions that, if executed by the computing device, cause the computing device to perform the actions associated with the component as discussed below. In one embodiment, the functionality of components depicted as being separate may be performed by a single component, and in another embodiment, the functionality of a component depicted as a single component may be split between multiple components. Components of the powertrain configuration device 100 are described as presenting information. In the illustrated embodiments, presenting information is shown in the context of a point-and-click computer interface display. Other forms of presentation, such as transmitting information to another computing device to create such a display, presenting information in a different type of interface, and the like, are within the scope of the appended claims.

The powertrain configuration device 100 also includes a performance data store 108 and an order data store 112. The performance data store 108 includes detailed information concerning the performance characteristics of the powertrain components available for selection by the customer 92. In one embodiment, the performance data store 108 includes a plurality of look-up tables regarding the performance characteristics of various combinations of customer selections. Possible contents of such look-up tables are described further below. In another embodiment, the performance data store 108 includes data identifying the individual performance characteristics of powertrain components, from which other components of the powertrain configuration device 100 can compute the mutual performance of combinations of those components. The order data store 112 is configured to store information identifying components selected by the customer 92, optimization goals selected by the customer 92, and any acknowledgement submitted by the customer 92 to ignore those goals. Such stored information is used during order fulfillment and subsequent performance troubleshooting.

In one embodiment, each of the data stores includes a database that stores the described data in a structured format and is hosted by the powertrain configuration device 100. In another embodiment, each of the data stores include databases that reside on a computing device separate from the powertrain configuration device 100, and are accessed by the components via a network. One of ordinary skill in the art will recognize that, in other embodiments, the data described as being stored in these data stores may be stored by any suitable type of device.

FIGS. 2A-2H illustrate one embodiment of a method 200 of designing a vehicle powertrain according to various embodiments of the present disclosure. From a start block (FIG. 2A), the method 200 proceeds to a set of method steps 202 defined between a continuation terminal ("terminal A") and an exit terminal ("terminal B"). The set of method steps 202 describe steps in which vehicle configuration options are obtained from a customer 92 for a desired vehicle.

From terminal A (FIG. 2B), the method 200 proceeds to block 216, where an interface component 102 presents one or more vehicle configuration options to a customer 92. Next, the method 200 proceeds to block 218, where the interface component 102 receives inputs from the customer 92 corresponding to each of the presented vehicle configuration options. Next, at block 220, a selection processing component 104 receives one or more specification values representing vehicle components selected by the customer 92 from the vehicle configuration options.

The vehicle configuration options include one or more configurable components that make up a vehicle powertrain. For example, the interface component 102 may present a plurality of engine models, transmission models, rear tire models, and the like to the customer 92, from which the customer will make selections to build the powertrain configuration. In one embodiment, the interface component 102 and the selection processing component 104 ensure that the selections made by the customer 92 are compatible with one another before allowing the customer 92 to proceed.

As discussed above, the interface component 102 generates a user interface that is presented to the user by the interface component 102 via the client computing device 90. For ease of discussion, the interface component 102 will be described as generating and presenting the user interface, as well as interacting with the customer 92. One of ordinary skill in the art understands the role played by the client computing device 90 in these activities, and so further discussion of the details of how the client computing device 90 participates in these activities has been omitted.

The method 200 then proceeds to block 222, where the selection processing component 104 receives one or more use values provided by the customer relating to an expected use of the vehicle. The expected use values help determine a performance baseline the vehicle should meet in order to provide an adequate experience to the operator. The expected use values may include a gross combined weight, an application, a maximum expected grade, a road surface, a percentage of off-highway operation, a cruise speed, and the like. The maximum expected grade and road surface may be specified by the customer 92, or may be retrieved by the selection processing component 104 upon the selection by the customer 92 of a particular operating area.

The "application" describes different types of use that may affect the desired performance profile of the vehicle. For example, the customer 92 may be given the choice between a line haul application, a vocational application, and a pickup/delivery application. A vehicle used for a line haul application is expected to spend eight to ten hours a day traveling at constant highway speeds over long distances. In such an application, the system can modify the performance optimization goals more aggressively to maximize fuel economy.

A vehicle used for a vocational application is expected to carry varying amounts of weight through stop-and-go traffic, or to travel other short distances before idling for a considerable time. Examples of vocational application vehicles include mixers, snow plows, garbage trucks, and the like. The system can adjust the performance optimization goals for a vocational application more aggressively to maximize gradability, before optimizing for fuel economy.

A vehicle used for a pickup/delivery application is expected to travel moderate distances through traffic before stopping, such as a city delivery truck, an ambulance, a fire truck, and the like. The system can change the performance optimization goals for a pickup/delivery application to increase gradability, though it does not increase gradability as aggressively compared to fuel economy compared to the vocational application.

Next, the method 200 proceeds to terminal B, and then to another set of method steps 204 (FIG. 2A) defined between a continuation terminal ("terminal C") and an exit terminal ("terminal D"). The set of method steps 204 describe steps in which startability of the desired vehicle configuration is checked.

From terminal C (FIG. 2C), the method 200 proceeds to block 224, where a validation component 106 computes a desired startability value based on the received use values. A vehicle's "startability" is the maximum grade at which the vehicle can start moving from a dead stop. Computation of the desired startability value starts at the maximum expected grade, and then references the other use values and the performance data store 108 to determine how much higher than the maximum expected grade the desired startability value should be. For example, the validation component 106 may increase the desired startability value from the maximum expected grade based on various anticipated operating conditions, including an expected road surface that is softer or more slippery than asphalt, a percentage of off-highway driving, and the like. The validation component 106 may also increase the desired startability value by a constant factor, or a constant factor based on the specified application, to ensure that the startability will provide adequate performance.

Next, at block 226, the validation component 106 computes a predicted startability value based on the received specification values. The predicted startability value is the maximum grade on which the vehicle, as configured, is predicted to be able to start moving from a dead stop. The validation component 106 may reference the performance data store 108 to retrieve performance values for the selected vehicle components in order to compute the predicted startability value. For example, the validation component 106 may retrieve the torque-at-engagement for the selected engine, the highest gear ratio for the selected transmission, and other relevant performance characteristics of the vehicle components from the performance data store 108.

The method 200 then proceeds to block 228, where the validation component 106 compares the predicted startability value to the desired startability value to determine a startability test value. In one embodiment, if the predicted startability value is greater than or equal to the desired startability value, the startability test value is "pass;" otherwise, the startability test value is "fail."

Next, at block 230, the validation component 106 stores the desired startability value, the predicted startability value, and the startability test value for later use. The method 200 then proceeds to block 232, where the selection processing component 104 transmits the specification values, use values, and startability values to an order processing component 110. Next, at block 234, the order processing component 110 stores the specification values, use values, and startability values in an order data store 112 as part of an order record. In one embodiment, each of the specification values and the use values are represented by a sales code when stored in the order data store 112. For example, each powertrain component can be represented by a sales code, as can each application selected by the customer 92. For other use values, such as the maximum expected grade, the possible values specified by the customer 92 may be broken up into half-percent increments, each of which is assigned a specific sales code. In another embodiment, such free-form use values are stored as numerical values in the order record.

The method 200 then proceeds to terminal D, and then to another set of method steps 206 (FIG. 2A) defined between a continuation terminal ("terminal E") and an exit terminal ("terminal F"). The set of method steps 206 describe steps in which a selection of an available performance goal is obtained.

From terminal E (FIG. 2D), the method 200 proceeds to block 236, where the selection processing component 104 determines one or more available powertrain optimization goals based on the specification values and the use values. Powertrain optimization goals may include performance, balance, and fuel economy. Optimizing the powertrain for performance includes setting thresholds that prioritize maximizing available power over other functionality goals such as fuel economy. Optimizing the powertrain for fuel economy includes setting thresholds that prioritize maximizing fuel economy over other functionality goals such as power. Optimizing the powertrain for balance includes setting thresholds that provide both a reasonable amount of power and a reasonable level of fuel economy.

Next, at block 238, the interface component 102 presents the available powertrain optimization goals to the customer 92. FIG. 3A illustrates an exemplary embodiment of a display of several optimization goal options 302. In the illustrated example, each of the powertrain optimization goals of performance, balance, and fuel economy are available to the customer 92 for the given vehicle configuration selections. However, the interface component 102 may determine that the selected vehicle components cannot achieve one or more of the powertrain optimization goals. For example, the interface component 102 may determine that there are no available components that could be paired with the selected engine to meet the thresholds required to achieve the fuel economy optimization goal, for the specified gross combined weight and cruise speed. In such a scenario, the interface component 102 does not display the fuel economy optimization goal to the customer 92, or displays the fuel economy optimization goal in the optimization goal options 302 area in a disabled state.

The method 200 then proceeds to block 240, where the selection processing component 104 receives a selected powertrain optimization goal from the customer 92, and transmits it to the order processing component 110. In one embodiment, the selection processing component 104 also saves the selected powertrain optimization goal for later use. Next, in block 242, the order processing component 110 stores the selected powertrain optimization goal in the order data store 112, and the method proceeds to terminal F.

From terminal F (FIG. 2A), the method 200 proceeds to another set of method steps 208 defined between a continuation terminal ("terminal G") and an exit terminal ("terminal H"). The set of method steps 208 describe steps in which gradability of the desired vehicle configuration is checked. Gradability is the maximum grade at which the vehicle can maintain its rate of travel at a given engine speed in a given transmission gear. For example, if a vehicle has a gradability of 2.3% at 50.8 MPH and 1300 RPM, that means that the vehicle could maintain that speed on a grade of up to 2.3% before the engine and vehicle speed begin to reduce due to vehicle power demand exceeding available engine power at 1300 RPM.

From terminal G (FIG. 2E), the method 200 proceeds to block 244, where the validation component 106 computes a minimum acceptable gradability at cruise and a minimum acceptable gradability at peak torque based on the use values and the optimization goal. The gradability at cruise is the maximum grade at which the vehicle as configured can maintain its specified cruising speed in its top gear. The gradability at peak torque is the maximum grade at which the vehicle as configured can maintain its speed in any gear when the engine speed is producing its peak torque. A reasonable degree of gradability can help improve vehicle fuel economy by limiting the amount of time the operator drives the vehicle in a gear lower than top gear. The validation component 106 may compute the minimum acceptable gradability values based on the application, the chosen performance optimization goal, and the specified gross combined weight, and may retrieve the minimum acceptable gradability values from a look-up table stored in the performance data store 108.

Next, at block 246, the validation component 106 computes a predicted gradability at cruise value and a predicted gradability at peak torque value based on the specification values. The method 200 then proceeds to block 248, where the validation component 106 compares the predicted gradability at cruise value to the minimum acceptable gradability at cruise to determine a gradability at cruise test value, and to block 250, where the validation component 106 compares the predicted gradability at peak torque value to the minimum acceptable gradability at peak torque to determine a gradability at peak torque test value. If the predicted gradability at cruise value is greater than or equal to the minimum acceptable gradability at cruise, the gradability at cruise test value is a "pass" value; otherwise, the gradability at cruise test value is a "fail" value. Likewise, if the predicted gradability at peak torque value is greater than or equal to the minimum acceptable gradability at peak torque, the gradability at peak torque test value is a "pass" value; otherwise, the gradability at peak torque test value is a "fail" value.

In one embodiment, the validation component 106 compares the predicted performance at the highest transmission gear ratio of the specified vehicle configuration to the thresholds related to gradability and engine speed discussed above. In another embodiment, the validation component 106 compares the predicted performance at other transmission gear ratios, such as the second highest transmission gear ratio, to the thresholds in instances where the use values indicate an extreme use case.

Maintaining gradability in top gear while traveling at high speeds or while carrying a large load is more difficult than maintaining gradability in a lower gear. In an extreme use case, switching to the lower gear when dealing with increased grades can be preferable to configuring the vehicle to perform adequately on grades in top gear, at least because there will be greater configuration options to meet the requirements. Accordingly, in a case where the validation component 106 detects an extreme use case, the validation component 106 may indicate a "pass" value if the predicted performance is adequate in the second highest gear but not the top gear. For example, if the specified gross combined weight is higher than a threshold or the specified cruise speed is higher than a threshold, the validation component 106 uses the second highest transmission gear ratio, instead of the highest transmission gear ratio, to calculate the predicted gradability and engine speed for determining the test values.

Next, at block 252, the validation component 106 stores the predicted gradability at cruise value and corresponding test value, as well as the predicted gradability at peak torque value and corresponding test value.

The method 200 then proceeds to terminal H, and to another set of method steps 210 defined between a continuation terminal ("terminal I") and an exit terminal ("terminal J"). The set of method steps 210 describe steps in which engine speed of the desired vehicle configuration is checked.

From terminal I (FIG. 2F), the method 200 proceeds to block 254, where the validation component 106 computes a minimum engine speed and maximum engine speed based on the use values, the specification values, and the optimization goal. In one embodiment, the minimum engine speed and maximum engine speed are targets between which the selected engine performs optimally. For example, the validation component 106 may query the performance data store 108 based on the engine manufacturer specifications to determine a performance profile of the engine, and then find a minimum engine speed and a maximum engine speed that meet the specified performance goal for the given application. As another example, the validation component 106 may retrieve minimum and maximum engine speeds from a look-up table based on the engine make, the performance optimization goal, and the application.

Next, at block 256, the validation component 106 computes a predicted engine speed at cruise value for one or more gear ratios based on the specification values. In one embodiment, the validation component 106 computes the predicted engine speed for the highest gear ratio available for a selected transmission. The method 200 then proceeds to block 258, where the validation component compares the predicted engine speed at cruise value to the minimum and maximum engine speeds to determine an engine speed test value. If the predicted engine speed at cruise is between the minimum and maximum engine speeds, the engine speed test value is a "pass" value; otherwise, the engine speed test value is a "fail" value. Next, at block 260, the validation component 106 stores the minimum engine speed, the maximum engine speed, the predicted engine speed at cruise value, and the engine speed test value.

The method 200 then proceeds to terminal J, and to another set of method steps 212 defined between a continuation terminal ("terminal K") and an exit terminal ("terminal L"). The set of method steps 212 describe steps in which additional configuration options are obtained and checked.

From terminal K (FIG. 2G), the method 200 proceeds to block 262, where the interface component 102 presents the startability value, the gradability at cruise value, the gradability at peak torque value, and the cruise engine speed value to the customer, and to block 264, where the interface component 102 presents the startability test value, the gradability at cruise test value, the gradability at peak torque test value, and the engine speed test value to the customer. As discussed below with respect to FIGS. 3A-3D, the interface component 102 may display the results of these computations and test values along with other information to help the customer 92 understand the results of the tests and the performance of the selected vehicle configuration.

Next, at block 266, the interface component 102 determines one or more additional configuration options compatible with the previously chosen options, each configuration option having one or more values. For example, the interface component 102 determines one or more rear axle ratios that are functionally compatible with the previously selected vehicle components. The method 200 proceeds to block 268, where the validation component 106 re-evaluates each test value for each additional configuration option value, and to block 270, where the interface component 102 presents each of the one or more additional configuration options to the customer, including indicating configuration option values having positive test values. For example, in FIG. 3A, the interface component 102 has determined a plurality of rear axle ratios that can be used with the previously selected vehicle components, and has displayed them in a set of rear axle ratio options 304. Further, the interface component 102 has displayed the rear axle ratios between 3.90 and 4.63 as bold and indented to indicate that these rear axle ratios can meet the selected "performance" optimization goal.

Next, at block 274, the selection processing component 104 receives a selection from the customer 92 for the one or more additional configuration options. For example, as depicted in FIG. 3A, the customer 92 has selected the 4.11 gear ratio. Alternatively, one of the gear ratios that satisfies the performance goal (such as the 4.11 gear ratio) may be selected by default. If the selection received by the selection processing component 104 is different from the currently displayed selection, the interface component 102 recalculates the information shown in the startability display 310, the powertrain profile display 312, and the test value display 314 to reflect the newly selected rear axle ratio.

The method 200 then proceeds to terminal L, and to another set of method steps 214 defined between a continuation terminal ("terminal M") and an exit terminal ("terminal N"). The set of method steps 214 describe steps in which final customer choices are obtained and stored.

From terminal M (FIG. 2H), the method 200 proceeds to block 276, where, if the customer selected a configuration option value having a negative test value, the interface component 102 presents a prompt to the customer requesting acknowledgement of the negative test. The response to the prompt is received and stored by the selection processing component 104 along with the rest of the selections provided by the customer 92. For example, if the customer 92 selected a rear axle ratio that does not meet the fuel economy performance optimization goal, the customer 92 may acknowledge a prompt that indicates that the customer 92 agrees that the selected components will not provide the initially desired level of fuel economy.

Next, at block 278, the selection processing component 104 transmits each customer selection to the order processing component 110. The method 200 then proceeds to block 280, where the order processing component 110 saves each customer selection to the order data store 112, and instructs the interface component 102 to proceed with an ordering process. The method 200 then proceeds to terminal N, then to an end block (FIG. 2A), and terminates.

The storage of each customer selection in the order data store 112, including storing an indication that the customer 92 acknowledged a failed test value, can help with troubleshooting vehicle performance after the vehicle is delivered. For example, if a customer 92 complains that a vehicle that the customer configured with an embodiment of the present disclosure is performing with poorer than expected fuel economy, a customer service representative can consult the order record in the order data store 112 to determine whether the customer 92 ignored any warnings that poorer that desired fuel economy would result from the customer's component selections. The stored customer selections may also be used to compare data from a vehicle electronic control unit (ECU), such as vehicle speed data obtained by the ECU from a vehicle speed sensor, engine speed data obtained by the ECU from an engine speed sensor, and the like, to the expected values entered by the customer. This can help determine whether the actual operation of the vehicle is consistent with the original order specification.

FIG. 3A illustrates one embodiment of a powertrain optimization interface 300, according to various embodiments of the present disclosure. The powertrain optimization interface 300 includes a set of optimization goal options 302, a set of rear axle ratio options 304, and a set of cruise speed options 306. Each of these sets of options are configured to accept input from the customer 92, and to cause the selection made by the customer 92 to be transmitted to the selection processing component 104 for further use. Further details concerning these portions of the powertrain optimization interface 300 were provided above.

The powertrain optimization interface 300 also includes a vehicle configuration display 308, a startability display 310, a powertrain profile display 312, and a test value display 314. The vehicle configuration display 308 provides the various vehicle configuration options chosen by the customer 92, such as a make and model of a selected engine, transmission, rear axle, rear tires, and the like. The vehicle configuration display 308 also provides use conditions specified by the customer 92, such as an expected rolling resistance, an expected engine fan operation state, and the like.

The startability display 310 provides a predicted startability value for the configured vehicle as a maximum percent grade on which the vehicle is expected to be able to start. As illustrated, a predicted startability value is provided for each of the lowest two transmission ratios. For other vehicle configurations, the startability display 310 may also provide information about an auxiliary transmission ratio and a transfer case ratio, for vehicles specifications that include such equipment. The powertrain optimization interface 300 may also include one or more interface buttons 316 to allow the customer 92 to navigate the powertrain optimization and ordering process.

The powertrain profile display 312 provides information concerning performance of the configured powertrain. The top two lines, for example, show the predicted gross torque provided by the selected engine at various engine speeds. The middle three lines show predicted performance values for the configured vehicle in a second highest gear, and the bottom three lines show predicted performance values for the configured vehicle in a highest gear. The predicted performance values include a transmission gear ratio, a rear axle ratio, and a predicted speed and gradability value for each of the various engine speeds. The display of this information allows the customer 92 to quickly identify whether the configured vehicle will have adequate performance within a predicted performance envelope, and how the vehicle configuration should change to improve performance to an acceptable level.

The test value display 314 provides the results of the tests performed earlier in the configuration process. In the illustrated embodiment, the test value display 314 provides both the pass/fail test result value, as well as text explaining the test that was performed and why the test passed or failed.

In FIG. 3A, the customer 92 has selected "performance" as an optimization goal from the optimization goal options 302. As shown in the test value display 314, this causes the minimum recommended gradability at peak torque to be 1.3%, and causes the recommended operating range for engine speed for the selected engine to be between 1450 RPM and 1800 RPM. Since the optimization goal is for performance, the minimum gradability at peak torque is allowed to be higher, and the engine speed range is wider and higher, than if the optimization goal had been for fuel economy. The illustration also shows that the customer 92 has selected a rear axle ratio of 4.11 and a typical operating speed of 60 MPH. These selections lead to the predicted performance values and test values displayed in the test value display 314. As shown, for the given selections, each of the tests has a PASS test value.

Figure 3B:
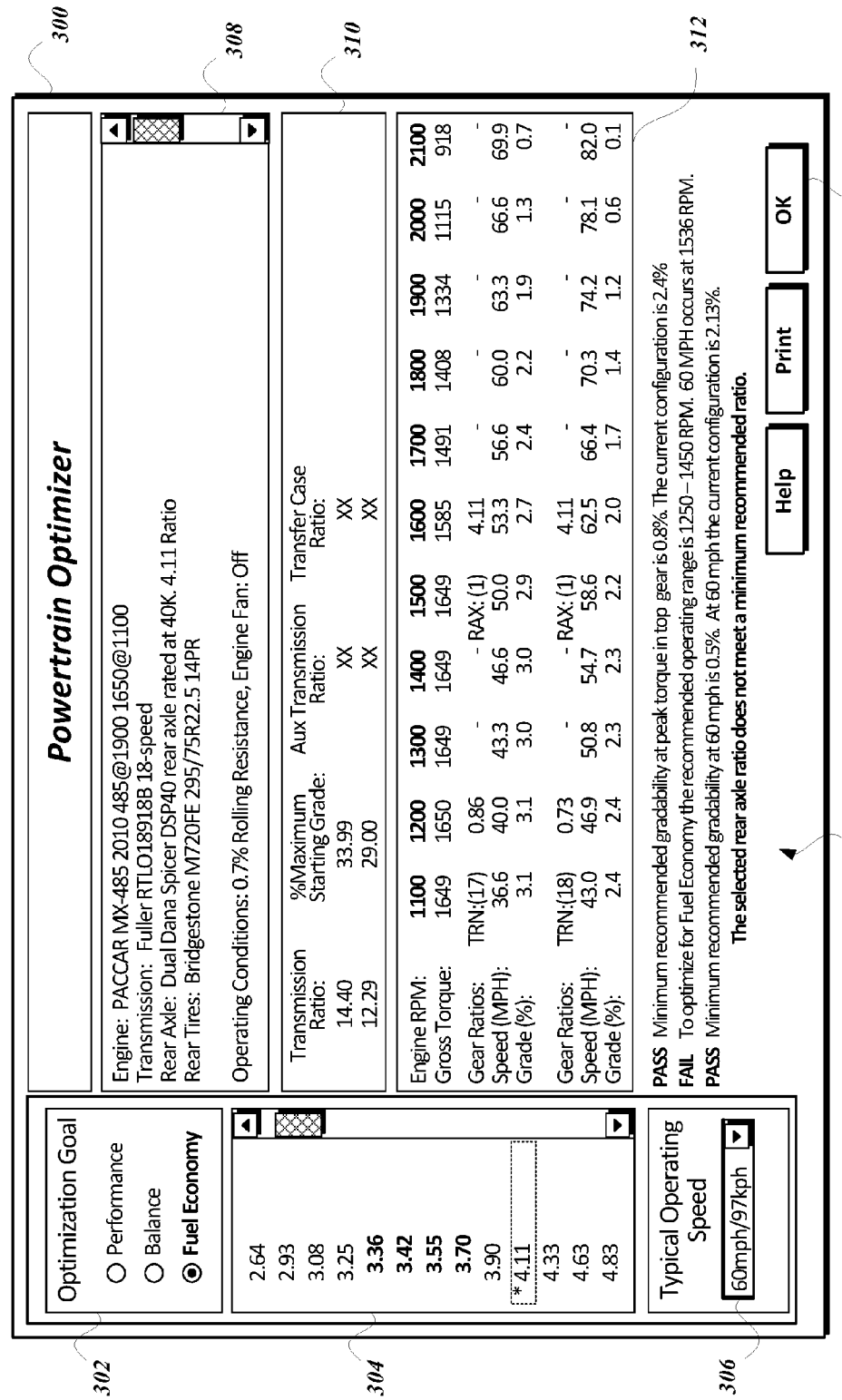
Figure 3C:
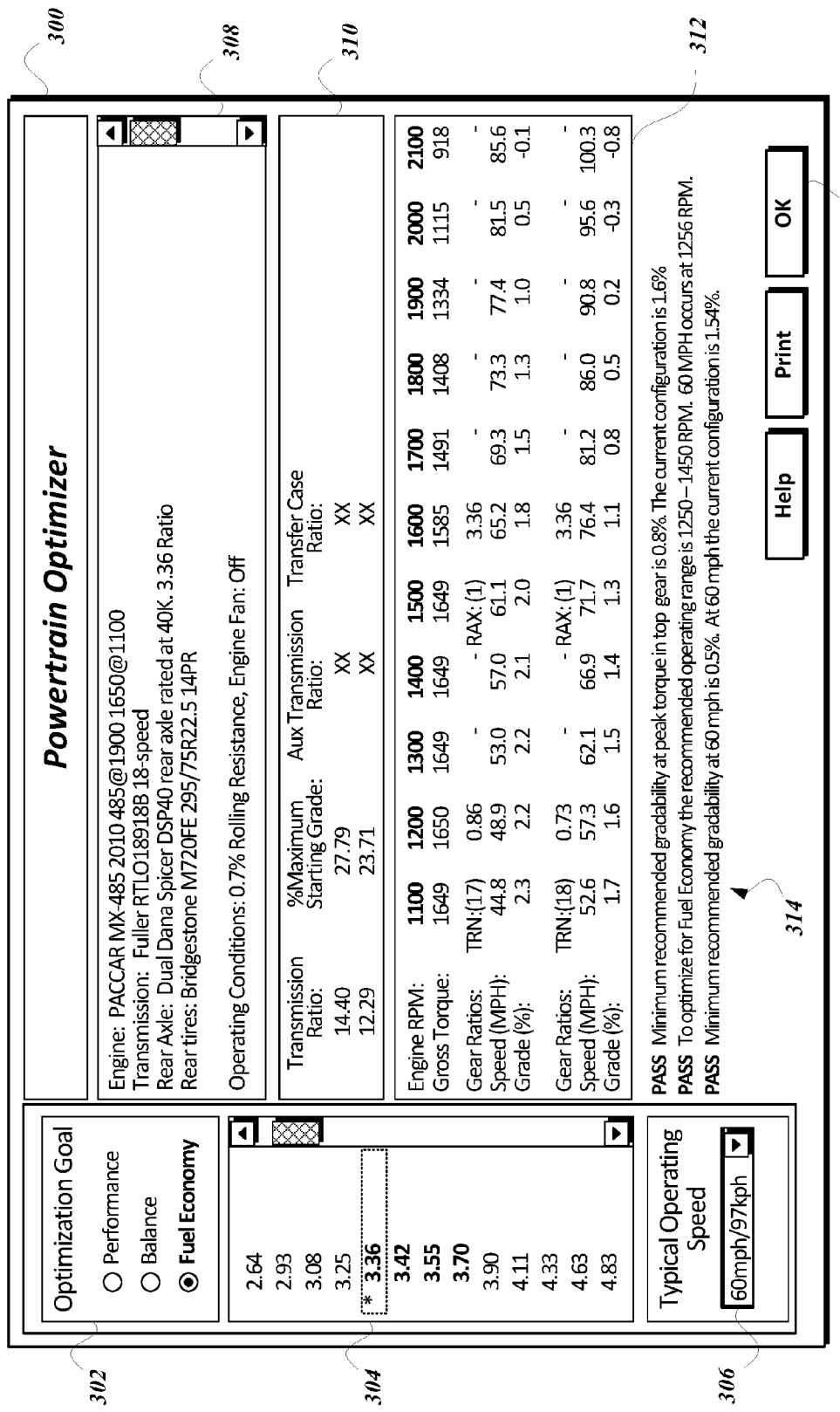
Figure 3D:

FIGS. 3B-3D illustrate how the powertrain optimization interface 300 may change in response to various changes in input by the customer 92 in one embodiment of the present disclosure. FIG. 3B illustrates changes that occur when the customer 92 using the powertrain optimization interface 300 illustrated previously in FIG. 3A changes the selected powertrain optimization goal to "fuel economy." As discussed above, the interface component 102 calculates which rear axle ratios will meet the optimization goals, and highlights only those rear axle ratios which meet the goals. When optimizing for performance, FIG. 3A shows that any rear axle ratio between 3.90 and 4.63 will meet the optimization goal. As shown in FIG. 3B, only rear axle ratios between 3.36 and 3.70 are highlighted, as only they will meet the fuel economy optimization goal if all other vehicle configuration options stay the same. Since the 4.11 rear axle ratio remains selected, the test value display 314 shows that the engine speed test now fails due to the lower and smaller recommended operating range. The test value display 314 also includes an additional prompt stating which test failed and explaining why.

FIG. 3C illustrates how the powertrain optimization interface 300 of FIG. 3B changes once the customer 92 selects a rear axle ratio of 3.36. Changing the selected rear axle ratio causes the selection processing component 104 to recalculate the values within the startability display 310 and the powertrain profile display 312. Since the rear axle ratio is lower, the available power will be lower (as illustrated by the lower predicted startability values and predicted gradability values), but the engine speed at a given operating speed will be lower (as illustrated by the higher speed values at a given engine speed). Since the engine speed value at the specified typical operating speed lies within the narrow recommended operating range for the fuel economy optimization goal, the engine speed test value is now PASS, and the test value display 314 no longer includes the prompt explaining the failed test.

FIG. 3D illustrates how the powertrain optimization interface 300 of FIG. 3C changes once the customer 92 raises the typical operating speed from 60 MPH to 70 MPH. Since the selected rear axle ratio has not changed, the values within the startability display 310 and the powertrain profile display 312 need not be recalculated, though the highlighted rear axle ratios in the rear axle ratio options 304 have again changed. The test value display 314 now shows that the engine speed test value is now FAIL, since even in top gear, the engine speed would be 1465 RPM at 70 MPH. The customer 92 is prompted by the test value display 314 that a lower rear axle ratio will be able to meet the fuel economy performance goal at 70 MPH.

The use of the particular vehicle performance measurements described above is exemplary only, and should not be considered limiting. In another embodiment, other vehicle performance measurements could be optimized. For example, instead of calculating minimum and maximum engine speed and determining whether the engine speed at cruise would fall between those values, the validation component 106 may calculate a maximum relative fuel consumption based on the performance optimization goal and the application, or may obtain a maximum relative fuel consumption based on customer drive cycle data. The validation component 106 may then calculate a predicted relative fuel consumption based on the engine, transmission, tires, and application specified by the customer 92, along with customer drive cycle data. The engine speed test value discussed above would then be replaced by a fuel consumption test value obtained by comparing the predicted relative fuel consumption to the maximum relative fuel consumption. As stated, analysis of other vehicle performance factors may also be possible.

While illustrative embodiments have been illustrated and described, it will be appreciated that various changes can be made therein without departing from the spirit and scope of the invention. Although the method and various embodiments thereof have been described as performing sequential steps, the invention is not intended to be so limited. As nonlimiting examples, the described steps need not be sequential and/or not all steps are required to perform the method. As such, one of ordinary skill will appreciate that such examples are within the scope of the claimed embodiments.

The embodiments of the invention in which an exclusive property or privilege is claimed are defined as follows:

1. A system for verifying use data of a configured powertrain, the system comprising:
 one or more computing devices configured to enable configuration of a powertrain, the one or more computing devices configured to:
  obtain a set of specification values and an optimization goal achievable for at least one expected use value;
  obtain a set of additional configuration options compatible with the set of specification values;
  for each additional configuration option of the set of additional configuration options, calculate a test value associated with the additional configuration option based on the optimization goal;

present the set of additional configuration options along with an indication of which additional configuration options of the set of additional configuration options are associated with a positive test value; and cause the powertrain to be configured according to one or more additional configuration option selections received by the computing device; and a vehicle comprising the configured powertrain and an electronic control unit (ECU);

wherein the ECU is configured to:

obtain use data comprising at least one of vehicle speed data and engine speed data; and output the obtained use data for comparison to the at least one expected use value for determining whether actual operation of the vehicle is consistent with the expected use value.

2. The system of claim 1, wherein calculating a test value further comprises calculating a gradability at peak torque test value, and wherein the test value is based on the gradability at peak torque test value.

3. The system of claim 1, wherein calculating a test value further comprises calculating a gradability at cruise test value, and wherein the test value is based on the gradability at cruise test value.

4. The system of claim 1, wherein calculating a test value further comprises calculating an engine speed test value, and wherein the test value is based on the engine speed test value.

5. The system of claim 4, wherein calculating the engine speed test value includes calculating a minimum engine speed and a maximum engine speed based on the set of specification values and the optimization goal.

6. The system of claim 1, wherein calculating a test value includes computing threshold values based on the set of specification values and the optimization goal.

7. The system of claim 1, wherein the one or more computing devices are further configured to obtain the at least one expected use value.

8. The system of claim 7, wherein calculating a test value includes computing threshold values based on the at least one expected use value.

9. The system of claim 1, wherein calculating a test value includes calculating test values for more than one transmission gear ratio in response to detecting an extreme use case.

10. The system of claim 1, wherein the vehicle further comprises at least one of a vehicle speed sensor or an engine speed sensor.

* * * * *